(12) United States Patent
Barclay et al.

(10) Patent No.: US 6,849,381 B2
(45) Date of Patent: Feb. 1, 2005

(54) COPOLYMERS AND PHOTORESIST COMPOSITIONS COMPRISING SAME

(75) Inventors: George G. Barclay, Jefferson, MA (US); Stefan J. Caporale, Worcester, MA (US); Wang Yueh, Shrewsbury, MA (US); Zhibiao Mao, Shrewsbury, MA (US); Joseph Mattia, Framingham, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/408,522

(22) Filed: Apr. 7, 2003

(65) Prior Publication Data

US 2003/0215742 A1 Nov. 20, 2003

Related U.S. Application Data

(63) Continuation of application No. 09/567,814, filed on May 9, 2000.
(60) Provisional application No. 60/185,345, filed on Feb. 26, 2000.

(51) Int. Cl.[7] .............................................. G03F 7/004
(52) U.S. Cl. ...................... 430/270.1; 430/905; 430/910
(58) Field of Search .............................. 430/270.1, 905, 430/910; 526/281

(56) References Cited

U.S. PATENT DOCUMENTS

| | | | |
|---|---|---|---|
| 6,013,416 A | * | 1/2000 | Nozaki et al. ............ 430/283.1 |
| 6,132,926 A | * | 10/2000 | Jung et al. ................ 430/270.1 |
| 6,147,249 A | | 11/2000 | Watanabe et al. |
| 6,165,674 A | | 12/2000 | Taylor et al. |
| 6,207,342 B1 | | 3/2001 | Takechi et al. |
| 6,239,231 B1 | | 5/2001 | Fujishima et al. |
| 6,277,538 B1 | | 8/2001 | Choi et al. |
| 6,284,429 B1 | | 9/2001 | Kinsho et al. |
| 6,492,086 B1 | * | 12/2002 | Barclay et al. .......... 430/270.1 |
| 6,692,888 B1 | | 2/2004 | Barclay et al. |

FOREIGN PATENT DOCUMENTS

JP 11-305444 A 11/1999

OTHER PUBLICATIONS

JPO Abstract of JP 11–305444, Nov. 1999.

* cited by examiner

*Primary Examiner*—Rosemary Ashton
(74) *Attorney, Agent, or Firm*—Peter F. Corless; Darryl P. Frickey; Edwards & Angell, LLP

(57) ABSTRACT

The present invention includes polymers and photoresist compositions that comprise the polymers as a resin binder component. Photoresists of the invention include chemically-amplified positive-acting resists that can be effectively imaged at short wavelengths such as sub-200 nm, particularly 193 nm. Polymers of the invention suitably contain 1) photoacid labile groups that preferably contain an alicyclic moiety; 2) a polymerized electron-deficient monomer; 3) a polymerized cyclic olefin moiety. Particularly preferred polymers of the invention are tetrapolymers or pentapolymers, preferably with differing polymerized norbornene units.

20 Claims, No Drawings

COPOLYMERS AND PHOTORESIST COMPOSITIONS COMPRISING SAME

This application is a continuation of U.S. Ser. No. 09/567,814, filed May 9, 2000 and claims the benefit of U.S. provisional application No. 60/185,345 filed Feb. 26,2000.

BACKGROUND OF THE INVENTION

1. Field of the Invention

The present invention relates to new polymers and use of such polymers as a resin binder component for photoresist compositions, particularly chemically-amplified positive-acting resists that can be effectively imaged at short wavelengths such as sub-200 nm, particularly 193 nm.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are described in Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4.

More recently, chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a polar functional group is formed, e.g., carboxyl or imide, which results in different solubility characteristics in exposed and unexposed areas of the resist coating layer. See also R. D. Allen et al., Proceedings of SPIE, 2724:334–343 (1996); and P. Trefonas et al. Proceedings of the 11th International Conference on Photopolymers (Soc. Of Plastics Engineers), pp 44–58 (Oct. 6, 1997).

While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 250 nm or less, or even about 200 nm or less, such as wavelengths of about 248 nm (provided by KrF laser) or 193 nm (provided by an ArF exposure tool). See European Published Application EP915382A2. Use of such short exposure wavelengths can enable formation of smaller features. Accordingly, a photoresist that yields well-resolved images upon 248 nm or 193 nm exposure could enable formation of extremely small (e.g. sub-0.25 $\mu$m) features that respond to constant industry demands for smaller dimension circuit patterns, e.g. to provide greater circuit density and enhanced device performance.

However, many current photoresists are generally designed for imaging at relatively higher wavelengths, such as G-line (436 nm) and I-line (365 nm) are generally unsuitable for imaging at short wavelengths such as sub-200 nm. Even shorter wavelength resists, such as those effective at 248 nm exposures, also are generally unsuitable for sub-200 nm exposures, such as 193 nm imaging.

More specifically, current photoresists can be highly opaque to extremely short exposure wavelengths such as 193 nm, thereby resulting in poorly resolved images.

It thus would be desirable to have new photoresist compositions, particularly resist compositions that can be imaged at short wavelengths such as sub-200 nm exposure wavelengths, particularly 193 nm.

SUMMARY OF THE INVENTION

We have now found novel polymers and photoresist compositions that comprise the polymers as a resin binder component. The photoresist compositions of the invention can provide highly resolved relief images upon exposure to extremely short wavelengths, particularly sub-200 nm wavelengths such as 193 nm.

In particular, photoresists that contain preferred polymers of the invention can exhibit significant resistance to plasma etchants. See, for instance, the results set forth in Example 7, which follows.

In a first aspect of the invention, polymers are provided that contain at least three distinct repeat units as follows:

1) a group that include a photoacid-labile moiety, particularly a photoacid-labile group that contains an alicyclic group, e.g. a photoacid-labile ester such as a polymerized alkyl acrylate or alkylmethacrylate preferably where the alkyl group is an alicyclic such as adamantyl, fencyl, and the like;

2) a group that contains a polymerized electron-deficient monomer that is non-photoacid-labile, or at least less reactive (e.g. 2 or 3 times less reactive) to photoacid than units 1), such as an ethylene unsaturated ketone or di-ketone, e.g. an anhydride such as maleic anhydride, itaconic anhydride, citrionic anhydride; amides such as maleimide; esters, particularly lactones; etc.; and 3) a group that includes a polymerized cyclic olefin moiety (i.e. where the olefinic group is polymerized along the polymer backbone to provide a fused carbon alicyclic group).

Without being by theory, it is believed the combined use in polymers of the invention of i) carbon alicyclic groups (provided by polymerization of a cyclic olefin such as a norbornene); and ii) photoacid-labile groups that contain an alicyclic moiety, can impart significantly enhanced resistance to plasma etchants to photoresist that contain such polymers. See the comparative results set forth in Example 7 below. Such etch resistance can be critical to achieve desired results in high performance applications, e.g. forming highly resolved sub-half micron or sub-quarter micron resist features.

Preferred polymers contain at least one additional distinct unit (particularly tetrapolymers or pentapolymers) such as an additional, distinct polymerized cyclic olefin unit. In such tetrapolymers and pentapolymers, suitably at least two distinct polymer units may contain photoacid-acid labile groups. For example, tetrapolymer or pentapolymer may contain a photoacid-labile acrylate and a cyclic olefin, e.g. a polymerized norbornene, that has a photoacid-labile substituent such as a photoacid-labile ester.

Preferred polymers include those that contain a polymerized first norbornene repeat unit, and a polymerized second norbornene repeat unit, where the second unit is distinct from the first unit. For instance, the first norbornene repeat unit can be unsubstituted, and the second norbornene repeat unit can have one or more non-hydrogen repeat units. Alternatively, the first and second norbornene repeat units each can have one or more non-hydrogen ring substituents, but where the non-hydrogen substituent(s) of the first norbornene repeat unit is different than the non-hydrogen substituent(s) of the second norbornene repeat unit.

The addition of at least two different norbornene monomers enables desired control of lithographic properties of the polymer, particularly with respect to etch resistance, dissolution contrast, adhesion and resolution. For instance, for enhancing adhesion, a first norbornene monomer (e.g. not substituted with any non-hydrogen substitutents) can be polymerized and a second norbornene monomer that has one or more alcohol substituents can be polymerized. For enhanced dissolution control, a first norbornene monomer (e.g. not substituted with any non-hydrogen substitutents) can be polymerized and a second norbornene monomer that has one or more lactone substituents can be polymerized. For enhanced dissolution contrast, a first norbornene monomer (e.g. not substituted with any non-hydrogen substituents, or substituted with other group such as an alcohol or lactone) can be polymerized and a second norbornene monomer that has one or more photoacid-labile substituents can be polymerized.

Thus, in a preferred aspect of the invention, polymers are provided that contain at least two distinct polymerized norbornene repeat units. Preferably such polymers also will contain photoacid-labile groups, either as a substituent of one or both of the two distinct norbornene repeat units, or as a polymer repeat unit separate from the norbornene units. For example, photoacid-labile acrylate units may be present together with the two or more distinct polymerized norbornene repeat units.

In a further aspect of the invention, polymers of the invention are provided that contain at least two distinct units that each have photoacid labile groups. For instance, a polymer may contain an acrylate unit with a photoacid-labile group, and a polymerized norbornene group that has a pendant photoacid-labile group. Alternatively, a polymer of the invention may contain at least two distinct photoacid-labile acrylate units.

In a still further aspect of the invention, polymers of the invention contain a photoacid labile group that contains a tertiary ester alicyclic hydrocarbon group that has two or more fused or bridged rings, and in at least certain aspects of the invention, the alicyclic hydrocarbon group is preferably other than adamantyl. Preferred tertiary ester groups include optionally substituted fencyl groups, particularly ethyl fencyl; optionally substituted pinanyl; and optionally substituted tricyclo decanyl, particularly an alkyl-substituted tricyclo decanyl such as 8-ethyl-8-tricyclodecanyl such as provided by polymerization of 8-ethyl-8-tricyclodecanyl acrylate and 8-ethyl-8-tricyclodecanyl methacrylate. Additional alicyclic ester groups also will be suitable, including additional bicyclic, tricyclic and other polycyclic moieties.

Generally preferred polymers of the invention include those that contain at least one repeat unit that comprises a photoacid-labile group, which contains an alicyclic hydrocarbon moiety. Polymers of the invention also may contain multiple, distinct repeat units, e.g. two distinct repeat units, that each comprise a photoacid-labile group, which contains an alicyclic hydrocarbon moiety.

The invention also includes polymers that contain one or more of the above features. For instance, preferred are terpolymers, tetrapolymers, pentapolymers or other higher order polymers that contain at least the above groups 1) through 3), i.e. 1) (photoacid-labile group); 2) (polymerized electron-deficient monomer); and 3) (polymerized cyclic olefin moiety), preferably where at least two distinct units 1) through 3) each has photoacid labile groups, e.g. the cyclic olefin unit may have a photoacid-labile group. As referred to herein, a cyclic olefin typically refers to a compound that has all carbon ring members (also referred to as a carbon alicyclic). The cyclic olefin will have at least one endocyclic carbon-carbon double bond and will non-aromatic. The endocyclic double bond can serve to polymerize the cyclic group, providing an alicyclic ring fused to the polymer backbone, i.e. two adjacent ring carbons of the cyclic group also are part of the polymer backbone.

Also preferred are terpolymers, tetrapolymers, pentapolymers or other higher order polymers that contain at least the above groups 1) through 3), and where the polymer contains a photoacid labile group that contains a tertiary ester alicyclic hydrocarbon group that has two or more fused or bridged rings, and suitably is other than adamantyl.

Polymers of the invention also may contain units in addition to the above groups. For example, polymers of the invention also may contain nitrile such as provided by polymerization of methacrylonitrile and acrylonitrile. Additional contrast enhancing groups also may be present in polymers of the invention, such as groups provided by polymermization of methacrylic acid, acrylic acid, and such acids protected as photoacid labile esters, e.g. as provided by reaction of ethoxyethyl methacrylate, t-butoxy methacrylate, t-butylmethacrylate and the like.

Polymers of the invention are preferably employed in photoresists imaged at 193 nm, and thus preferably will be substantially free of any phenyl or other aromatic groups. For example, preferred polymers contain less than about 5 mole percent aromatic groups, more preferably less than about 1 or 2 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

The invention also provides methods for forming relief images, including methods for forming a highly resolved relief image such as a pattern of lines where each line has essentially vertical sidewalls and a line width of about 0.40 microns or less, and even a width of about 0.25, 0.20 or 0.16 microns or less. The invention further provides articles of manufacture comprising substrates such as a microelectronic wafer substrate or liquid crystal display or other flat panel display substrate having coated thereon a polymer, photoresist or resist relief image of the invention.

In a still further aspect, the invention includes novel compounds that are useful to prepare polymers of the invention. In particular, 8-alkyl-8-tricyclodecanyl acrylate and 8-alkyl-8-tricyclodecanyl methacrylate are provided, together with methods of synthesis of those monomers.

Other aspects of the invention are disclosed infra

DETAILED DESCRIPTION OF THE INVENTION

Polymers of the invention comprise contain one or more repeat units that comprise a photoacid-labile group. Preferred polymers contain a photoacid labile ester group with a tertiary alicyclic hydrocarbon ester moiety that is preferably other than adamantyl. Preferred tertiary alicyclic hydrocarbon ester moieties are polycyclic groups such ethylfencyl group or a tricyclo decanyl moiety. References herein to a "tertiary alicyclic ester group" or other similar term indicate that a tertiary alicyclic ring carbon is covalently linked to the ester oxygen, i.e. —C(=O)O—TR where T is a tertiary ring carbon of alicyclic group R. In at least many cases, preferably a tertiary ring carbon of the alicyclic moiety will be covalently linked to the ester oxygen, such as exemplified by the below depicted specifically preferred polymers. However, the tertiary carbon linked to the ester oxygen also can be exocyclic to the alicyclic ring, typically where the alicyclic ring is one of the substituents of the exocyclic tertiary carbon (see for instance the substituted cyclohexyl group below having a molecular volume of 161 $\text{Å}^3$). Typically, the tertiary carbon linked to the ester oxygen will be substituted by the alicyclic ring itself, and/or one, two or three alkyl groups having 1 to about 12 carbons, more typically 1 to about 8 carbons, even more typically 1, 2, 3 or 4 carbons. The alicyclic group also suitably will not contain aromatic substitution. The alicyclic groups may be suitably monocyclic, or polycyclic, particularly bicyclic or tricyclic groups.

Polymers of the invention also may contain photoacid-labile groups that do not contain an alicyclic moiety. For example, polymers of the invention may contain photoacid-labile ester units, such as a photoacid-labile alkyl ester. Generally, the carboxyl oxygen (i.e. the carboxyl oxygen as underlined as follows: —C(=O)$\underline{O}$) of the photoacid-labile ester will be covalently linked to quaternary carbon. References herein to a "quaternary" carbon indicate the carbon atom has four non-hydrogen substituents (i.e. $\underline{C}RR^1R^2R^3$ where R, $R^1$, $R^2$ and $R^3$ are each the same or different and each is other than hydrogen). See, for instance, Morrison and Boyd, *Organic Chemistry*, particularly at page 85 ($3^{rd}$ ed., Allyn and Bacon), for a discussion of the term quaternary. More particularly, preferred non-cyclic photoacid labile groups include t-butyl esters and more highly branched systems where the ester group comprises an optionally substituted alkyl moiety having about 5 or preferably 6 or more carbon atoms, with at least two branched carbon atoms, i.e. at least two secondary, tertiary or quaternary carbon atoms. Suitable alkyl moieties include those that have one, two or more tertiary carbon atoms, and/or one, two or more quaternary carbons. References herein to a "secondary" carbon indicate the carbon atom has two non-hydrogen substituents (i.e. $\underline{C}H_2RR^1$ where R and $R^1$ are the same or different and each is other than hydrogen); references herein to a "tertiary" carbon indicate the carbon atom has three non-hydrogen substituents (i.e. $\underline{C}HRR^1R^2$ where R, $R^1$ and $R^2$ are the same or different and each is other than hydrogen). See, again, Morrison and Boyd, *Organic Chemistry*, particularly at page 85 ($3^{rd}$ ed., Allyn and Bacon), for a discussion of those terms secondary and tertiary. It also should be understood that references herein to "alkyl" are inclusive of linked or branched carbon chains such as alkylidene, alkylene and the like.

Some preferred highly branched photoacid-labile esters include the following:

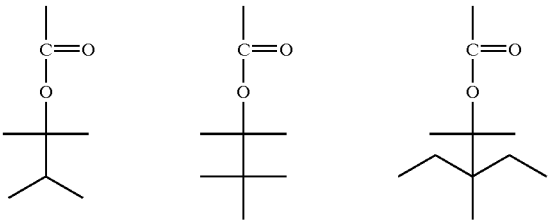

Polymers of the invention may contain units in addition to the alkyl esters units described above. For example, polymers may contain additional photoacid-labile groups such as pendant esters such as those of the formula —WC(=O)$OR^5$, wherein W is a linker such as a chemical bond, an alkylene particularly $C_{1-3}$ alkylene, or carbocyclic aryl such as phenyl, or aryloxy such as phenoxy, and $R^5$ is a suitable ester moiety such as an optionally substituted alkyl (including cycloalkyl) suitably having from 1 to about 20 carbons, more preferably about 4 to about 12 carbons, but without a noncyclic or single ring alkyl group having 5 or more carbons and two or more secondary, tertiary or quaternary carbons; optionally substituted alkenyl (including cycloalkenyl) group suitably having from 2 to about 20 carbons, more preferably about 4 to about 12 carbons; optionally substituted alkynyl group suitably having from 2 to about 20 carbons, more preferably about 4 to about 12 carbons; optionally substituted alkoxy group suitably having from 1 to about 20 carbons, more preferably 2 to about 12 carbons; or a heteroalicyclic group that contains one or more N, O or S atoms and one or more rings having from 4 to about 8 ring members such as tetrahydrofuranyl, thienyl, tetrahydropyranyl, morpholino and the like. Specifically preferred $R^5$ groups include e.g. t-butyl, tetrahydropyran, ethoxyethyl, or an alicyclic group including bridged groups such as such as adamantyl including 2-methyl-2-adamantyl, norbornyl, isobornyl and the like. Polymers of the invention also may contain aromatic units, such as polymerized vinylphenol, styrene units and the like. Such aromatic units are particularly suitable for polymers used in photoresists imaged at 248 nm. However, as discussed above, for even shorter wavelength imaging, such as 193 nm, preferably a polymer is substantially, essentially or completely free of aromatic units.

Preferred polymers of the invention include those of the following Formula I:

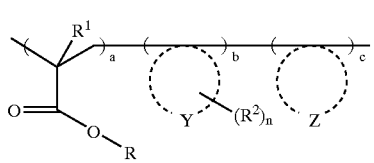

wherein R provides a photoacid-labile moiety and is a non-cyclic alkyl or more preferably tertiary alicyclic group such as optionally substituted alkyl fenchyl, optionally substituted tricyclo decanyl, optionally substituted pinanyl, or optionally substituted alkyl adamantyl;

$R^1$ is hydrogen or optionally substituted alkyl such as $C_{1-6}$ alkyl, and preferably $R^1$ is hydrogen or methyl;

$R^2$ is a non-hydrogen substituent such as $C_{1-8}$ alkyl; $C_{1-8}$ alkoxy; a photoacid-labile group such as t-butyl ester and the like; an alicyclic group such as cyclohexyl and the like; a lactone; etc.

Y is a polymerized fused, cyclic olefin unit, preferably forming a five, six, seven or eight membered carbon alicyclic ring with two carbons of the polymer backbone, such as provided by an optionally substituted polymerized norbornene (the curved lines linking Y to the polymer backbone in Formula I designating the variable ring size);

Z is an a polymerized electron-deficient monomer which may linked to a single carbon of the polymer backbone, or may form a ring with two carbons of the polymer backbone such as a polymerized maleic anhydride (the dashed lines linking Z to the polymer backbone designating that Z may be linked to one or two carbons of the polymer backbone, and that Z may be of variable ring size);

n is an integer of from 0 (where the cyclic olefin group is unsubstituted) to about 6, 7 or 8, and preferably n is 0, 1 or 2;

a, b and c are each mole percent of the depicted polymer units and are each greater than 0. Preferably a is 1 to about 30, 40, 50, 60 or 70 mole percent, and b and c are each preferably 10 to 30, 40 or 50 mole percent.

As discussed above, tetrapolymers or pentapolymers are preferred such as polymers that contain distinct polymerized cyclic olefin units, in addition to photoacid-labile units and other units, e.g. polymers of the following Formula II:

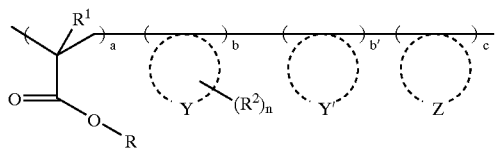

wherein R, $R^1$, Y, Z and $R^2$, n, a, b, and c are the same as defined above for Formula I; and Y' is the same as defined for Y in Formula I (but not does have any non-hydrogen substituents); and b' is the same as defined for b in Formula I.

Particularly preferred polymers of the invention include a structure of the following Formula III:

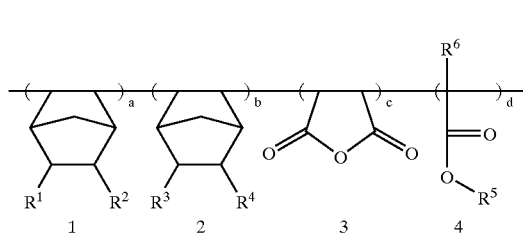

wherein $R^1$, $R^2$, $R^3$ and $R^4$ are each independently hydrogen or a non-hydrogen substituent, and $R^1$ and $R^2$ together are different than $R^3$ and $R^4$ together (i.e. so that polymerized norbornene unit 1 is different than polymerized norbornene unit 2), and $R^1$ and $R^2$ may be taken together, and $R^3$ and $R^4$ may be taken together to form a fused ring, e.g. a ring having 5, 6, 7 or 8 carbon ring members;

$R^5$ is a moiety that provides a photoacid-labile group, such as a tertiary alicyclic group as discussed above, or a branched non-cyclic optionally substituted alkyl group, wherein the ester carboxyl group is directly bonded to a quaternary carbon atom;

$R^6$ is hydrogen or alkyl, preferably $C_{1-6}$ alkyl particularly methyl;

a, b, c and d are each mole fractions of the respective polymer units and are each greater than zero.

In Formula III, preferably a is from 5 to 40 mole percent, more preferably 5 to 20 mole percent; preferably b is from 5 to 40 mole percent, more preferably 5 to 20 mole percent; preferably c is from 10 to 50 mole percent, more preferably 20 to 40 mole percent; and preferably d is from 5 to 70 mole percent, more preferably 10 to 50 mole percent.

In Formula III, preferably the sum of a, b, c and d is at least about 70 mole percent (i.e. at least 70 mole percent of the total polymer consists of the above depicted units 1, 2, 3 and 4), more preferably the sum of a, b, c and d is at least about 80, 90 or 95 mole percent of total polymer units, or the sum of a, b, c and d is about 100 mole percent of total polymer units.

Preferred alicyclic moieties (e.g. $R^5$ in Formula III above) of photoacid labile ester groups of polymers of the invention have rather large volume. It has been found that such bulky alicyclic groups can provide enhanced resolution when used in copolymers of the invention.

More particularly, preferred alicyclic groups of photoacid labile ester groups will have a molecular volume of at least about 125 or about 130 Å$^3$, more preferably a molecular volume of at least about 135, 140, 150, 155, 160, 165, 170, 175, 180, 185, 190, 195, or 200 Å$^3$. Alicyclic groups larger than about 220 or 250 Å$^3$ may be less preferred, in at least some applications. References herein to molecular volumes designate volumetric size as determined by standard computer modeling, which provides optimized chemical bond lengths and angles. A preferred computer program for determining molecular volume as referred to herein is Alchemy 2000, available from Tripos. For a further discussion of computer-based determination of molecular size, see T Omote et al, *Polymers for Advanced Technologies*, volume 4, pp. 277–287.

Some specifically preferred alicyclic groups of acid labile esters of the invention are shown immediately below together with the ester oxygen linkage, and with volumetric size values (Å³) listed to the right of the alicyclic group.

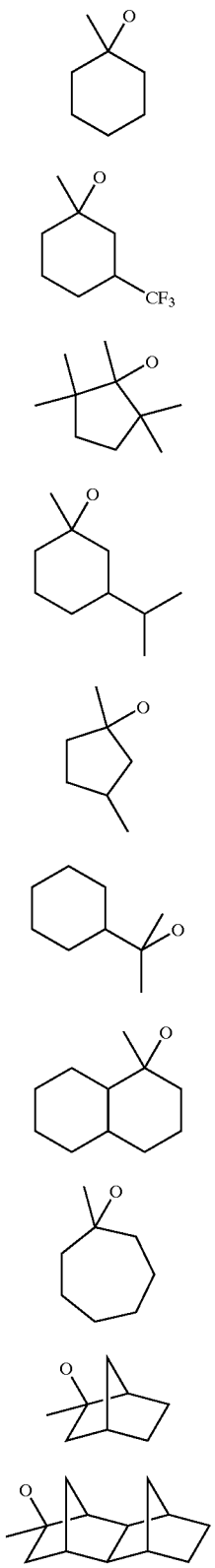

127

155

178

178

128

161

183

144

134

197

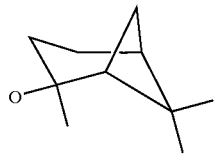

168

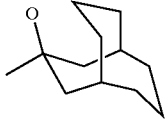

196

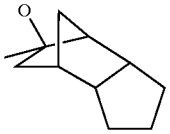

175

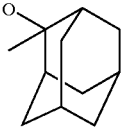

172

Additional preferred alicyclic moieties of ester groups of polymers of the invention include the following, where the wavy line indicates the covalent linkage to the carboxyl oxygen of the ester group:

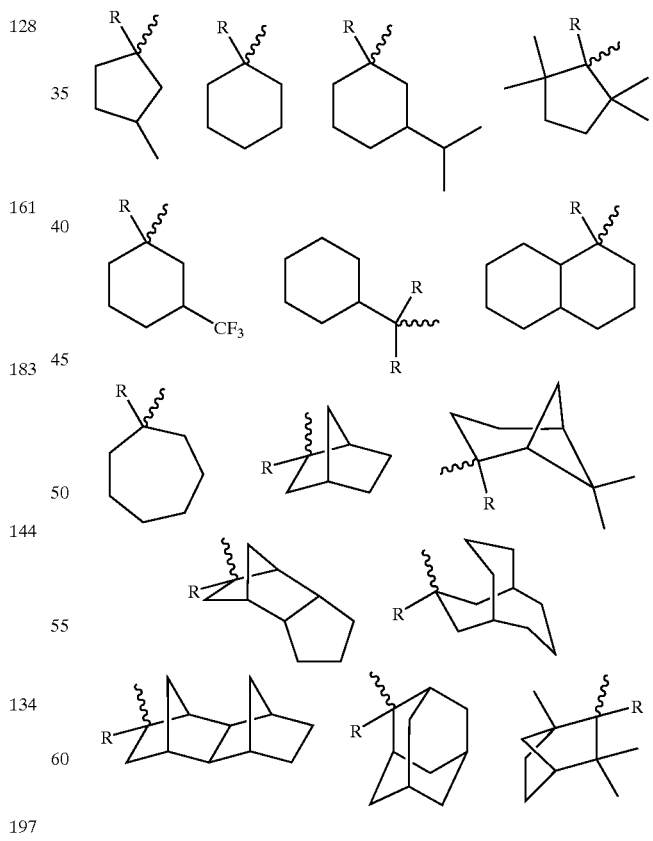

wherein in the above depicted structures, R is suitably optionally substituted alkyl, preferably optionally substituted $C_{1-8}$ alkyl, more preferably optionally substituted $C_{1-6}$ alkyl such a methyl, ethyl, propyl and the like.

Particularly preferred polymers of the invention include the following:

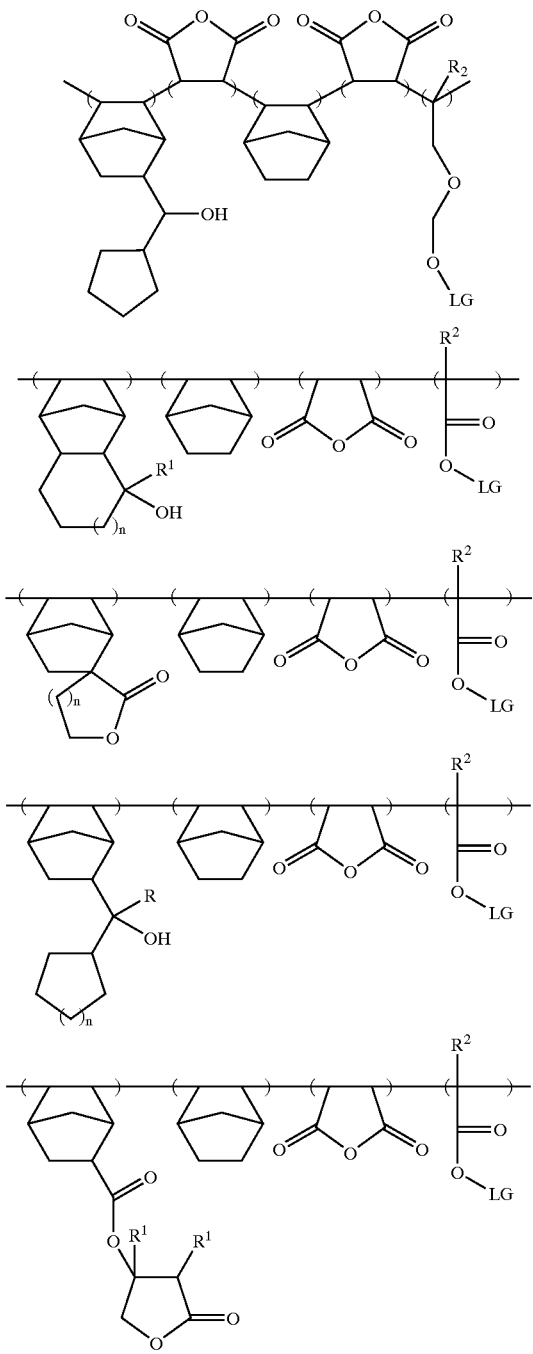

In those above polymers structures, "LG" desingates a photoacid-labile leaving group and is suitably the same as defined for substituent $R^5$ in Formula III above and is preferably methyladamantyl, 8-ethyl-8-tricyclodecanyl and the like. $R^1$ in the above polymer structures is suitably $C_{1-12}$ alkyl, such as methyl, ethyl, propyl and the like. The group n is suitably an integer of 1, 2, 3, or 4, and preferably is 1 or 2. $R^2$ in the above polymer structures is suitably hydrogen or $C_{1-8}$ alkyl, preferably methyl.

Specifically preferred polymers of the invention include the following, with specifically preferred molar ratios of the respective polymer units shown to the right of the depicted polymer:

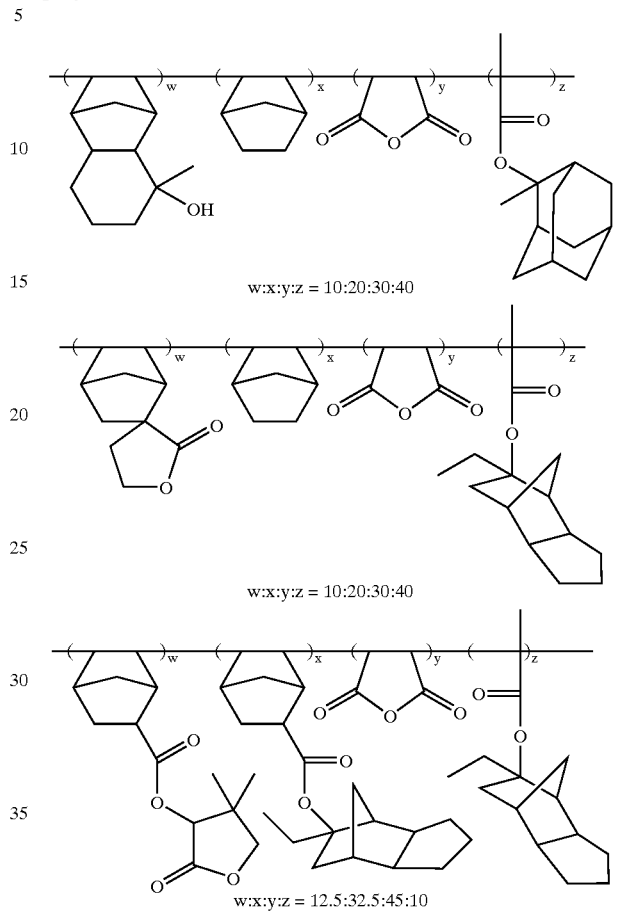

Polymers of the invention can be prepared by a variety of methods. One suitable method is an addition reaction which may include free radical polymerization, e.g., by reaction of selected monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). Suitable reaction solvents include e.g. tetrahydrofuran, ethyl lactate and the like. Suitable reaction temperatures for any particular system can be readily determined empirically by those skilled in the art based on the present disclosure. A variety of free radical initiators may be employed. For example, azo compounds may be employed such as azo-bis-2,4-dimethylpentanenitrile. Peroxides, peresters, peracids and persulfates also could be employed.

As discussed above, the invention also include novel compounds that are useful to prepare polymers of the invention, particularly 8-alkyl-8-tricyclodecanyl acrylate, preferably 8-($C_{1-16}$alkyl)-8-tricyclodecanyl acrylate such as 8-propyl-8-tricyclodecanyl acrylate, 8-ethyl-8-tricyclodecanyl acrylate, and 8-methyl-8-tricyclodecanyl acrylate; 8-alkyl-8-tricyclodecanyl methacrylate, preferably 8-($C_{1-16}$alkyl)-8-tricyclodecanyl methacrylate such as 8-propyl-8-tricyclodecanyl methacrylate, 8-ethyl-8- tricyclodecanyl acrylate, and 8-methyl-8-tricyclodecanyl methacrylate, such as compounds of the following structures:

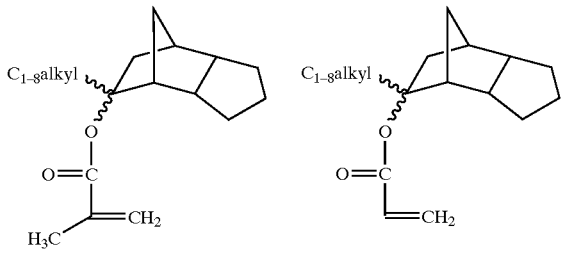

Those above tricyclodecanyl compounds can be synthesized by reaction of an alkyl Grignard reagent such as ethylmagnesium chloride, with a tricyclodecane compound and an acroyl or methacroyl compound, preferably such as methacryolyl chloride (to provide a tricyclodecanyl methacrylate) or acryolyl chloride (to provide a tricyclodecanyl acrylate). The reaction is preferably conducted in a suitable non-protic solvent such as tetrahydrofuran. Preferably the Grignard reagent and tricyclodecane compound are admixed solvent at reduced temperature with slow addition (e.g. 0.25, 0.5, 1.0 hours or more hours) of the acroyl or methacroyl compound. The reaction mixture can be allowed to warm to room temperature with stirring, e.g. overnight. See Example 1 which follows for exemplary preferred conditions.

Other monomers that can be reacted to provide a polymer of the invention can be identified by those skilled in the art. For example, to provide units of Formula I, suitable monomers include e.g. methacrylate or acrylate that contains the appropriate R group substitution on the carboxy oxygen of the ester group. Itaconic anhydride is another preferred reagent, preferably purified such as by extraction with chloroform. Vinyl lactones are also preferred reagents, such as alpha-butyrolactone.

As discussed, various moieties may be optionally substituted, including groups of Formulae I, II and III. A "substituted" substituent may be substituted at one or more available positions, typically 1, 2, or 3 positions by one or more suitable groups such as e.g. halogen (particularly F, Cl or Br); $C_{1-8}$ alkyl; $C_{1-8}$ alkoxy; $C_{2-8}$ alkenyl; $C_{2-8}$ alkynyl; hydroxyl; alkanoyl such as a $C_{1-6}$ alkanoyl e.g. acyl and the like; etc Preferably a polymer of the invention will have a weight average molecular weight (Mw) of about 800 or 1,000 to about 100,000, more preferably about 2,000 to about 30,000, still more preferably from about 2,000 to 15,000 or 20,000, with a molecular weight distribution (Mw/Mn) of about 3 or less, more preferably a molecular weight distribution of about 2 or less. Molecular weights (either Mw or Mn) of the polymers of the invention are suitably determined by gel permeation chromatography.

Polymers of the invention used in photoresist formulations should contain a sufficient amount of photogenerated acid labile ester groups to enable formation of resist relief images as desired. For instance, suitable amount of such acid labile ester groups will be at least 1 mole percent of total units of the polymer, more preferably about 2 to 40, 50, 60 or 70 mole percent, still more typically about 3 to 30, 40, 50, 60 or 70 mole percent of total polymer units. See the examples which follow for exemplary preferred polymers.

As discussed above, the polymers of the invention are highly useful as a resin binder component in photoresist compositions, particularly chemically-amplified positive resists. Photoresists of the invention in general comprise a photoactive component and a resin binder component that comprises a polymer as described above.

The resin binder component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

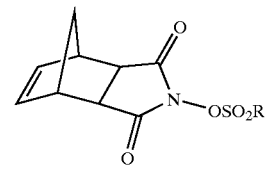

wherein R is camphor, adamantane, alkyl (e.g. $C_{1-12}$ alkyl) and perfluoroalkyl such as perfluoro($C_{1-12}$ alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents for 193 nm and 248 nm imaging are the following PAGS 1 and 2:

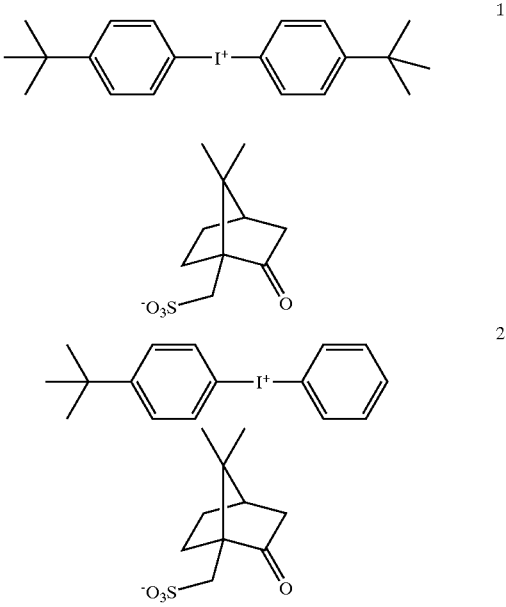

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$ alkyl), particularly perfluorooctanesulfonate, perfluorobutanesulfonate and the like.

Other known PAGS also may be employed in the resists of the invention. Particularly for 193 nm imaging, generally preferred are PAGS that do not contain aromatic groups, such as the above-mentioned imidosulfonates, in order to provide enhanced transparency.

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The resists of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether acetate, propylene glycol monomethyl ether; propylene glycol monomethyl ether acetate and 3-ethoxyethyl propionate. Typically, the solids content of the composition varies between about 5 and 35 percent by weight of the total weight of the photoresist composition. The resin binder and photoactive components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 mJ/cm$^2$, dependent upon the exposure tool and the components of the photoresist composition.

As discussed above, coating layers of the resist compositions of the invention are preferably photoactivated by a short exposure wavelength, particularly a sub-300 and sub-200 nm exposure wavelength. As discussed above, 193 nm is a particularly preferred exposure wavelength. 157 nm is another preferred exposure wavelength for resists of the invention. However, the resist compositions of the invention also may be suitably imaged at higher wavelengths. For example, a resin of the invention can be formulated with an appropriate PAG and a sensitizer if needed and imaged at higher wavelengths such as about 248 nm or 365 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention.

Examples 1–4

Monomer Syntheses

Example 1

EtTCD Methacrylate Monomer Synthesis

The monomer of 8-ethyl-8-tricyclodecanyl methacrylate (EtTCD methacrylate) was prepared as follows using the materials and amount thereof as specified in the following Table.

| Material | Amt (g) | Amt (ml) | Moles | Source |
|---|---|---|---|---|
| TCD | 150.22 | | 1.00 | TCI |
| Ethylmagnesiumchloride(25%) | 390.85 | ~379.5 | ~1.10 | ACROS |
| Methacryloyl chloride | 120.22 | ~112.4 | 1.15 | Aldrich |
| Tetrahydrofuran | 480 | 540 | | Aldrich |

All reaction glassware was dried in the oven overnight at 100° C. The glassware was set up and cooled under a stream of nitrogen. The reaction was carried out under a blanket of nitrogen.

To a 2L 3N-RB flask fitted with a gas inlet, thermometer, overhead stirrer and a rubber septum was added 400 g of ethylmagnesium chloride, 25 wt % solution in tetrahydrofuran (clear, amber solution) via a double tipped needle using nitrogen pressure. The mixture was cooled to −25 to −30° C. using a dry ice/isopropanol bath. While the ethylmagnesium chloride solution was cooling the 153.6 g of TCD (tricyclodecane) was dissolved in 480 g of tetrahydrofuran. To a 1L 3N-RB flask equipped with a gas inlet, glass stopper and a rubber septum was added the 153.6 g of TCD. The anhydrous, inhibitor free tetrahydrofuran was transferred to the 1L flask via a double tipped needle using nitrogen pressure. When the ethylmagesium chloride was at −25 to −30° C., the TCD/THF solution was transferred over a 2 hr period to the 2L 3N-RB flask containing the ethylmagnesium chloride via a double tipped needle using nitrogen pressure. The cooling bath was removed and the reaction mixture was stirred for 2 hr. After stirring for 2 hr the mixture was again cooled to −25 to −30° C. using a dry ice/isopropanol bath. The methacryloyl chloride (120.22 g) was then added dropwise over a 1 hour period using a 125 ml pressure equalizing dropping funnel. The reaction was allowed to come to room temperature with overnight stirring. A white precipitate developed from the clear amber colored reaction solution. Water (DI) was added until all of the salts had dissolved (~500 ml) and two distinct layer were seen. The layers were separated and the organic (upper) layer was washed with 2×400 ml DI water then dried over magnesium sulfate. The THF was removed leaving 258 g of an orange oil. The orange oil was dissolved in 400 g of hexane then passed through a 400 g silica gel plug which had been pre-conditioned with hexane. The silica was washed with hexane until all of the product was removed (spot filtrate on a TLC plate and illuminate under short UV). The hexane was removed leaving 202.8 g of an clear, colorless oil. Theoretical yield: 248.4 g; yield: 81.6%

Example 2

Synthesis of Norbornene Valerolactone

A solution of valerolactone (50.1 g) in 150 mL of anhydrous THF was placed in a three-neck-bottomed flask at −78° C. (Dry Ice/acetone). To it, solution of LDA (250 ML, 0.2 M) in 250 mL anhydrous THF was added dropwise. The reaction mixture was stirred at this temperature for 4 hours. Then, the thermal cracking of paraformaldehyde (36.94 g, excess) was bubbled into the reaction mixture. After the paraformaldehyde was all cracked, the reaction mixture was stirred at the same bath and stirred for overnight. Then, the solvent was removed by rotary pump and the residue was added 500 mL $CH_2Cl_2$ and washed with $NaHCO_3$ (aq, sat.) and water several times (3×500 mL). The combination organic solvent was dried over $MgSO_4$ and the solvent was removed by rotary pump. The desired product was distilled under vacuum (135–140° C./8 mmHg)

The methylene-valerolactone was dissolved in dichloromethane and freshly cracked cyclopentadiene was added. The reaction mixture was stirred at room temperature for 3 hours, then heated to 40° C., and held at 40° C. overnight. The reaction mixture was then slowly cooled to room temperature. The methylene chloride was removed under reduced pressure, leaving an oil. The crude oil was then distilled under reduced pressure to afford pure product.

Example 3

Synthesis of 8-methyltricyclodecanyl Methacrylate

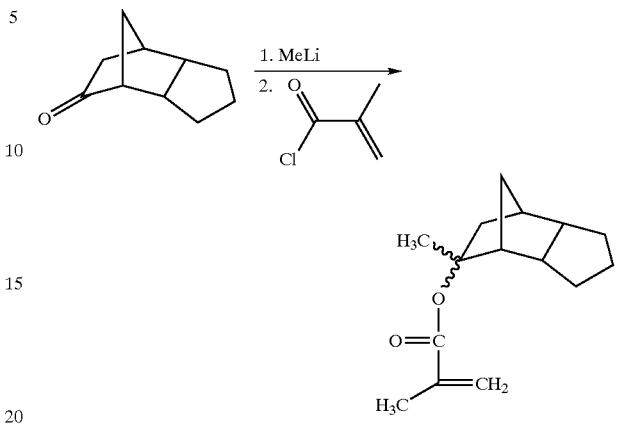

A solution of 125 ml of 1.4 M methyl lithium (in ethyl ether) in 100 ml of hexane was decanted into a three neck round-bottom flask at an ice-water bath. To it, a solution of 24.00 g of tricyclo[5.2.1.0]decan-8-one in hexane was added dropwise. After addition, the reaction mixture was stirred for 4 hours at 0° C. Then, a solution of 16 ml of methacroyl chloride in 100 ml of hexane was added dropwise at 0° C. After addition, the reaction mixture was stirred at the same bath for overnight (16 hours). After filtering the white salts, the organic layer was washed with water three times (3×300 ml). Then, the washed organic layer was dried over anhydrous $MgSO_4$. The organic solvent was removed by a rotary pump to give the crude title monomer (23.5 g). The monomer was purified by a flash column chromatography (purity >98%, silica gel with hexane). $^1$H NMR: 6.05 (1H), 5.50 (1H), 1.95 (3H), 1.65 (3H), 2.25–0.85 (14H).

Example 4

Synthesis of Pinanyl Methacrylate

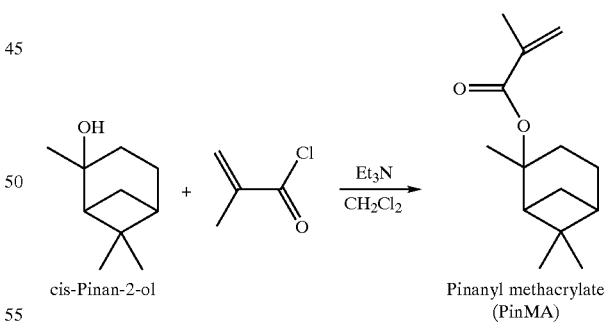

cis-Pinan-2-ol          Pinanyl methacrylate (PinMA)

Materials Used:

| | Amount Charged | Moles | Source |
|---|---|---|---|
| cis-Pinan-2-ol | 15.43 g | 0.10 | Fluka |
| $Et_3N$ | 12.14 g | 0.12 | Aldrich, distilled before use |
| Methacryloyl chloride | 13.07 g | 0.125 | Aldrich, distilled before use |

-continued

| Amount Charged | Moles | Source |
|---|---|---|
| $CH_2Cl_2$ 230 mL | | Aldrich, dried and distilled |

Procedure

All reaction glassware and needles were dried and flushed with dry $N_2$ before use and the reaction was carried out under nitrogen atmosphere.

1) Into a 500 mL 3-neck round-bottom-flask equipped with an addition funnel and a magnetic stirrer were added 15.43 g of cis-pinan-2-ol and 200 mL of dry $CH_2Cl_2$ (Stirred over $CaH_2$ overnight, then distilled and stored over activated molecular sieves). The resulting colorless solution was cooled with an ice-water bath.
2) Triethylamine (12.14 g) was added through the addition funnel to the cooled $CH_2Cl_2$ solution over 10 min. After added, the resulting solution was kept in a dry-ice/acetone bath (−67° C.).
3) A $CH_2Cl_2$ (30 mL) solution of methacryloyl chloride (13.07 g) was added dropwisely over 20 min. The resulting orangish suspension was allowed to warm to room temperature and stirred for 2 h.
4) The chloride salts were filtered off. The filtrate was washed with saturated $Na_2CO_3$ solution (2×200 mL), then DI water (3×200 mL), and dried over anhydrous $MgSO_4$.
5) The slightly yellow $CH_2Cl_2$ solution was concentrated on a rotary evaporator (bath temperature kept below 35°) to yield a clear slightly yellow liquid product. Yield=79%. The product was judged pure by NMR.

Example 5

Polymer Synthesis

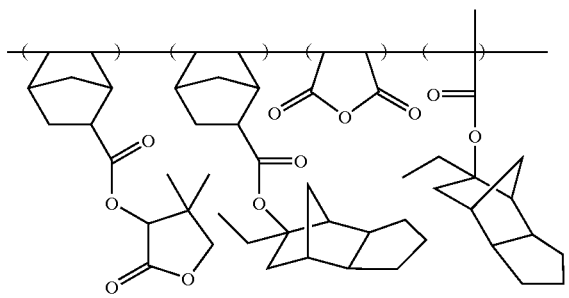

Norbornene pantolactone carboxylate/Norbornene ethyltricyclodecane carboxylate/Maleic Anhydride/Ethyl tricyclodecane methacrylate (molar ratio of respective units: 12.5:32.5:45:10)
Into a 100 ml Round bottom flask the following was weighted out:

| Ethyl tricyclodecane methacrylate | 2.53 grams (0.010 moles) |
| Norbornene pantolactone carboxylate | 3.16 grams (0.013 moles) |
| Maleic Anhydride | 8.17 grams (0.045 moles) |
| Norbornene ethyltricyclodecane carboxylate | 9.86 grams (0.033 moles) |
| V601 | 0.70 grams (0.003 moles) |
| 20 grams | THF |

A magnetic stir bar was added to the flask and the solution was stirred for ~15 minutes to dissolve the contents of the flask. Once in solution the flask was placed in a hot oil bath, preheated to 80° C. A condenser and $N_2$ line was attached on top and the reaction was allowed to stir for 24 hours. After 24 hours the heat was removed and the flask was allowed to cool to room temperature. After cooling to room temperature the contents of the flask was precipitated into 1.5 L (of 50/50 hexanes/IPA w/w). The precipitated solution was stirred for 1.5 hours and then the polymer was isolated, via a glass fretted funnel. Washed with 200 grams hexanes. Then the polymer was dried for 4 hours in the hood and then overnight in a vacuum oven, at room temperature. This reaction yielded 10 grams/20 grams of polymer, giving a 50% yield.

Example 6

Polymer Synthesis

A mixture of 2-methyladamantanyl methacrylate (15.00 g, 0.064 mol), maleic anhydride (4.71 g, 0.048 mol), norbornene (3.01 g, 0.032 mole), norbornyl-cyclopentanol (3.07 g, 0.016 mol), and V601 (1.11 g, 3% mole of total monomers) in 25.79 mL (1/1=monomer/solvent) of inhibitor free tetrahydrofuran was placed in a round-bottomed flask. After stirring for 5 minutes, the flask was put into a pre-heated (70° C.) oil bath. The reaction mixture was stirred at this temperature for 24 hours. After cooling, 25.79 g of THF was added to this flask. The polymer was isolated by precipitation into 1.5 L of hexane/IPA (1/1, % wt.). The suspension mixture was stirred for 120 minutes. Then, the polymer was filtered off and washed the polymer by additional 200 mL of hexane. The polymer was dried in a vacuum oven at 40° C. for overnight (about 16 hours). Yield =80%.

Example 7

Etch Resistance of Polymers of the Invention

Oxide etch rates of polymers of the invention were examined. The following preferred-tetrapolymer 1 (with molar ratios of tetrapolymer units shown to the right of the tetrapolymer structure) of the invention was tested for oxide etch rate:

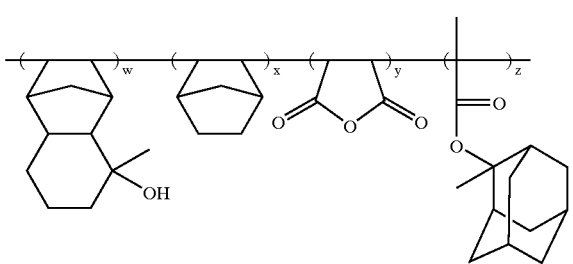

w:x:y:z = 10:20:30:40

That polymer 1 approximately the same resistance to oxide plasma etch as that of the following phenolic copolymer (with molar ratios of copolymer units shown to the right of the copolymer structure):

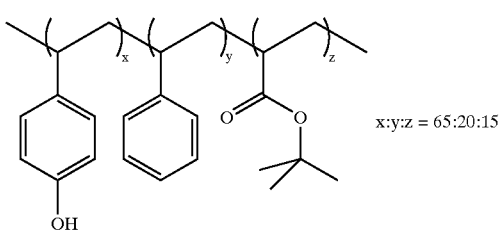

x:y:z = 65:20:15

Polymer 1 also exhibited approximately 30% greater resistance to oxide etch relative to the following copolymer (with molar ratios of polymer units shown to the right of the polymer structure):

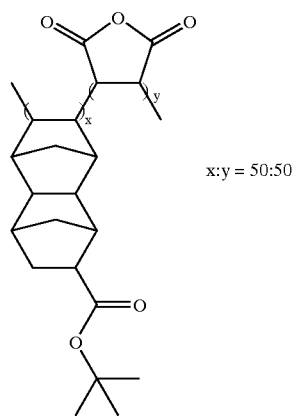

x:y = 50:50

Examples 8–9

Photoresist Preparation and Lithographic Processing

Example 8

A photoresist of the invention is prepared by mixing the following components with amount expressed as weight percents based on total weight of the resist composition:

| Resist components | Amount (wt. %) |
|---|---|
| Resin binder | 15 |
| Photoacid generator | 4 |
| Ethyl lactate | 81 |

The resin binder is the polymer of Example 5 above. The photoacid generator is di-(4-t-butylphenyl) iodonium (+/−)-10-camphor sulfonate (PAG 1 above). Those resin and PAG components are admixed in the ethyl lactate solvent.

The formulated resist composition is spin coated onto HMDS vapor primed 4 inch silicon wafers and softbaked via a vacuum hotplate at 90° C. for 60 seconds. The resist coating layer is exposed through a photomask at 193 nm, and then the exposed coating layers are post-exposure baked (PEB) at about 110° C. The coated wafers are then treated with 0.26 N aqueous tetramethylammonium hydroxide solution to develop the imaged resist layer and provide a relief image.

Example 8

A further photoresist of the invention is prepared by mixing the following components with amount expressed as weight percents based on total weight of the resist composition:

| Resist components | Amount (wt. %) |
|---|---|
| Resin binder | 28.2 |
| Photoacid generator | 0.52 |
| Base additive | 0.03 |
| Surfactant | 0.03 |
| Solvent | to provide 16 wt. % solids |

The resin binder is the polymer of Example 5 above. The photoacid generator is triphenylsulfonium triflate. The basic additive is triisopropanol amine. The surfactant is Silwet (Dow Chemical). Those resist components were formulated at 16 wt. % solids in a solvent of 2-heptatone.

The formulated resist composition is spin coated onto HMDS vapor primed 4 inch silicon wafers and softbaked via a vacuum hotplate at 130° C. for 60 seconds. The resist coating layer is exposed through a photomask at 193 nm, and then the exposed coating layers are post-exposure baked (PEB) at about 130° C. The coated wafers are then treated with 0.26 N aqueous tetramethylammonium hydroxide solution to develop the imaged resist layer and provide a relief image.

The foregoing description of the invention is merely illustrative thereof, and it is understood that variations and modification can be made without departing from the spirit or scope of the invention as set forth in the following claims.

What is claimed is:

1. A photoresist composition comprising a photoactive component and a resin comprising a polymer that comprises repeat units of:
   1) a group that comprises a photoacid-labile moiety comprising an alicyclic group;
   2) a group that contains a polymerized monomer that comprises a ethylene unsaturated carbonyl or di-carbonyl;
   3) a group that comprises a polymerized cyclic olefin moiety,
   the polymer comprising one or more moieties chosen from among nitrile and a photoacid labile group that comprises a leaving group other than an alicyclic moiety.

2. The photoresist of claim 1 wherein the polymer comprises one or more nitrile groups.

3. The photoresist composition of claim 2 wherein the polymer is at least substantially free of aromatic groups.

4. The photoresist composition of claim 2 wherein the polymer is completely free of aromatic groups.

5. The photoresist composition of claim 2 wherein the polymer comprises a lactone.

6. The photoresist composition of claim 1 wherein the group 2) that contains a polymerized monomer is an anhydride.

7. The photoresist composition of claim 2 wherein the group 2) that contains a polymerized monomer is an anhydride.

8. The photoresist composition of claim 2 wherein the group 2) that contains a polymerized monomer is a maleic anhydride group.

9. The photoresist composition of claim 2 wherein the a group that comprises a photoacid-labile moiety comprising an alicyclic group is an ester group.

10. The photoresist composition of claim 9 wherein the ester group comprises a tertiary alicyclic group.

11. The photoresist composition of claim 1 wherein the polymer comprises one or more photoacid labile groups that contain a leaving group other than an alicyclic moiety.

12. The photoresist composition of claim 1 wherein the group that comprises a polymerized cyclic olefin moiety is a polymerized norbornene group.

13. The photoresist composition of claim 1 wherein the photoresist comprises one or more photoacid generator compounds.

14. The photoresist composition of claim 1 wherein the polymer is at least substantially free of aromatic groups.

15. The photoresist composition of claim 1 wherein the polymer is completely free of aromatic groups.

16. The photoresist composition of claim 1 wherein the polymer comprises a lactone.

17. The photoresist composition of claim 1 wherein the group 2) that contains a polymerized monomer is a maleic anhydride group.

18. The photoresist composition of claim 1 wherein the a group that comprises a photoacid-labile moiety comprising an alicyclic group is an ester group.

19. The photoresist composition of claim 18 wherein the ester group comprises a tertiary alicyclic group.

20. A photoresist composition comprising a photoactive component and a polymer that comprises repeat units of:
a photoresist composition comprising a photoactive component and a resin comprising a polymer that comprises repeat units of:
1) a group that comprises a photoacid-labile moiety comprising an alicyclic group;
2) a group that contains a polymerized monomer that comprises a ethylene unsaturated carbonyl or di-carbonyl;
3) a group that comprises a polymerized cyclic olefin moiety,
wherein the polymer comprises a first polymerized norbornene repeat unit, and a second polymerized repeat unit, the first norbornene repeat unit not containing any non-hydrogen repeat units and the second norbornene repeat units comprising one or more non-hydrogen ring substituents.

* * * * *